United States Patent
Lu

(10) Patent No.: US 11,749,980 B2
(45) Date of Patent: Sep. 5, 2023

(54) METHOD FOR USING SEMICONDUCTOR INTELLIGENCE LINE

(71) Applicant: Chao-Cheng Lu, Taipei (TW)

(72) Inventor: Chao-Cheng Lu, Taipei (TW)

(*) Notice: Subject to any disclaimer, the term of this patent is extended or adjusted under 35 U.S.C. 154(b) by 0 days.

(21) Appl. No.: 17/539,621

(22) Filed: Dec. 1, 2021

(65) Prior Publication Data

US 2022/0271525 A1    Aug. 25, 2022

(30) Foreign Application Priority Data

Feb. 24, 2021  (TW) .................. 110106442

(51) Int. Cl.
*H02H 3/087* (2006.01)
*H02H 9/02* (2006.01)
*H02M 1/32* (2007.01)

(52) U.S. Cl.
CPC ............ *H02H 3/087* (2013.01); *H02H 9/025* (2013.01); *H02M 1/32* (2013.01)

(58) Field of Classification Search
CPC .......... H02H 3/087; H02H 9/025; H02H 9/02; H02H 3/08
See application file for complete search history.

(56) References Cited

U.S. PATENT DOCUMENTS

2008/0137249 A1* 6/2008 Harris .................... H02H 9/025
                                                          361/88

FOREIGN PATENT DOCUMENTS

TW    I692163 B    4/2020

OTHER PUBLICATIONS

Lecture 8 MOSFET (I) MOSFET I-V Characteristics. <https://web.mit.edu/6.012/www/SP07-L8.pdf>. 2007. (Year: 2007).*
AN4544 Application Note IGBT datasheet tutorial, <https://www.st.com/resource/en/application_note/an4544-igbt-datasheet-tutorial-stmicroelectronics.pdf>. Sep. 2014. (Year: 2014).*
ECSTUFF4U for Electronics Engineer. <https://www.ecstuff4u.com/search?updated-max=2018-01-29T23:27:00-08:00&max-results=7&reverse-paginate=true>. 2018. (Year: 2018).*
Taiwanese Office Action in application No. 110106442 dated May 5, 2021; pp. 1-2.
Notice of Rejection of Preliminary Examination dated Jul. 2, 2021; pp. 1-3.

* cited by examiner

*Primary Examiner* — Jared Fureman
*Assistant Examiner* — Christopher J Clark
(74) *Attorney, Agent, or Firm* — MUNCY, GEISSLER, OLDS & LOWE, P.C.

(57) ABSTRACT

The method for using semiconductor intelligence line of the invention, which is to set the semiconductor intelligence line on the drain source voltage axis of the first semiconductor output characteristic, has a gate voltage setting, which indicates the function of limiting the application limit of the drain source current on the output characteristic.

12 Claims, 4 Drawing Sheets under a setting of a gate voltage in an output characteristics table of the first semiconductor.

METHOD FOR USING SEMICONDUCTOR INTELLIGENCE LINE

FIELD OF THE INVENTION

The present invention relates to the technical field of a method for using a semiconductor intelligence line, which indicates a drain and a source of a first semiconductor to open circuit when a source current value exceeds the semiconductor intelligence line under a setting of a gate voltage in an output characteristics table of the first semiconductor.

BACKGROUND OF THE INVENTION

Since the invention of bipolar transistors in 1947 until now, a semiconductor intelligence line and its function of the present invention are never disclosed in an output characteristics table of a semiconductor data sheet, so that the present invention is a pioneering invention.

As shown in FIG. 1, please refer to Taiwan Invention Patent Publication No. I692163 "SHORT CIRCUIT PROTECTION DEVICE FOR DC POWER SOURCE", the patentee of I692163 is the same with the applicant of the present invention. In FIG. 1, the device includes a first semiconductor 10 and a second semiconductor circuit. The second semiconductor circuit includes a second semiconductor 11, a first resistance 12 and a second resistance 13. A source S of the first semiconductor 10 is connected to a negative terminal of a DC power supply 100 and a source S of the second semiconductor 11, a drain D of the first semiconductor 10 is connected to the negative terminal V− of the circuit, and a gate G of the first semiconductor 10 is connected to a drain D of the second semiconductor 11. The drain D of the second semiconductor 11 is connected to one end of the second resistance 13, the source S of the second semiconductor 11 is connected to the source S of the first semiconductor 10, the gate G of the second semiconductor 11 is connected to one end of the second resistance 13, the other end of the first resistance 12 is connected to the negative terminal V− of the circuit, and the other end of the second resistance 13 is connected to a positive terminal V+ of the circuit. The first semiconductor 10 is a n-channel metal oxide semiconductor field effect transistor (MOSFET), and the second semiconductor 11 is a n-channel metal oxide semiconductor field effect transistor. The positive terminal of the DC power supply 100 is connected to the positive terminal V+ of the circuit, and the negative terminal of the DC power supply 100 is connected to the source S of the first semiconductor 10 and the source S of the second semiconductor 11. The positive terminal V+ of the circuit is connected to the positive terminal of a load 200, and the negative terminal V− of the circuit is connected to the negative terminal of the load 200. The specification of the patent discloses that the first semiconductor 10 also includes a sixth semiconductor 15 (which is a n-type transistor) in FIG. 6 and a seventh semiconductor 16 (which is an insulated gate bipolar transistor (IGBT)) in FIG. 7. Here is a special statement that the first semiconductor 10 includes a MOSFET, IGBT or a n-type transistor. The patent "SHORT CIRCUIT PROTECTION DEVICE FOR DC POWER SOURCE" has a function for protecting the load 200 from a short circuit during a power supply process of the DC power supply 100.

SUMMARY OF THE INVENTION

In FIG. 1 and the specification of the prior art, the following statements about the establishment and the application of a semiconductor intelligence line related to the first semiconductor 10 are not mentioned:

1. The method for using a semiconductor intelligence line of the present invention is applied to a n-channel metal oxide semiconductor field effect transistor (N Channel MOSFET) includes various gate-source voltage settings, which indicates the corresponding source current and the corresponding drain-source voltage. When the load is overloaded or short-circuited and exceeds the corresponding drain current and the corresponding drain-source voltage, the drain and the source of the first semiconductor are turn into open circuits, so that the semiconductor intelligence line of the present invention indicates the drain and the source of the first semiconductor to open circuit.

2. The method for using a semiconductor intelligence line of the present invention is applied to an insulated gate bipolar transistor (IGBT) includes various gate-emitter voltage settings, which indicates the corresponding emitter current and the corresponding collector-emitter voltage. When the load is overloaded or short-circuited and exceeds the corresponding emitter current and the corresponding collector-emitter voltage, the collector and the emitter of the first semiconductor are turn into open circuits, so that the semiconductor intelligence line of the present invention indicates the collector and the emitter of the first semiconductor to open circuit.

3. The method for using a semiconductor intelligence line of the present invention is applied to an n-type transistor includes various base current settings, which indicates the corresponding collector current and the corresponding collector-emitter voltage. When the load is overloaded or short-circuited and exceeds the corresponding emitter current and the corresponding collector-emitter voltage, the collector and the emitter of the first semiconductor are turn into open circuits, so that the semiconductor intelligence line of the present invention indicates the collector and the emitter of the first semiconductor to open circuit.

The present invention has the following purposes:

The method for using a semiconductor intelligence line applied to the first semiconductor has a setting of a gate-source voltage. When the load is overloaded or short-circuited, the drain and the source of the first semiconductor are indicated to open circuit.

The method for using a semiconductor intelligence line applied to the first semiconductor has a setting of a gate-emitter voltage. When the load is overloaded or short-circuited, the collector and the emitter of the first semiconductor are indicated to open circuit.

The method for using a semiconductor intelligence line applied to the first semiconductor has a setting of a base current. When the load is overloaded or short-circuited, the collector and the emitter of the first semiconductor are indicated to open circuit.

The present invention has the following features:

1. The method for using a semiconductor intelligence line applied to a metal oxide semiconductor field effect transistor is the first in the world. The method has a setting of a gate-source voltage. When the load is overloaded or short-circuited, the drain and the source of the first semiconductor are indicated to open circuit.

2. The method for using a semiconductor intelligence line applied to an insulated gate bipolar transistor is the first in the world. The method has a setting of a gate-emitter voltage. When the load is overloaded or short-circuited, the collector and the emitter of the first semiconductor are indicated to open circuit.

3. The method for using a semiconductor intelligence line applied to an n-type transistor is the first in the world. The method has a setting of a base current. When the load is overloaded or short-circuited, the collector and the emitter of the first semiconductor are indicated to open circuit.

DETAILED DESCRIPTION OF THE PREFERRED EMBODIMENTS

Figure 1:
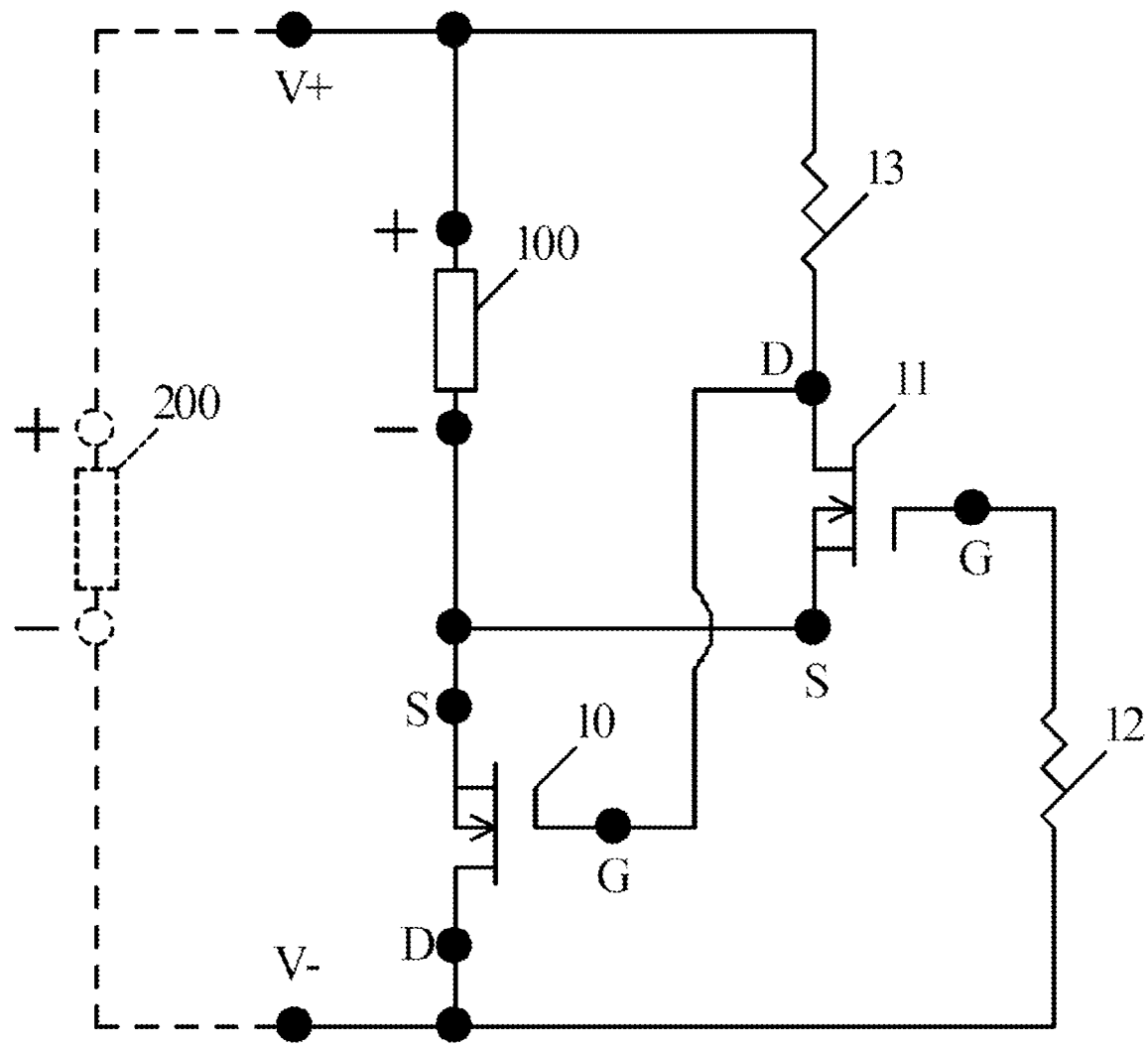
FIG. 1 is an embodiment of a short circuit protection device for a conventional DC power source.
Figure 2:
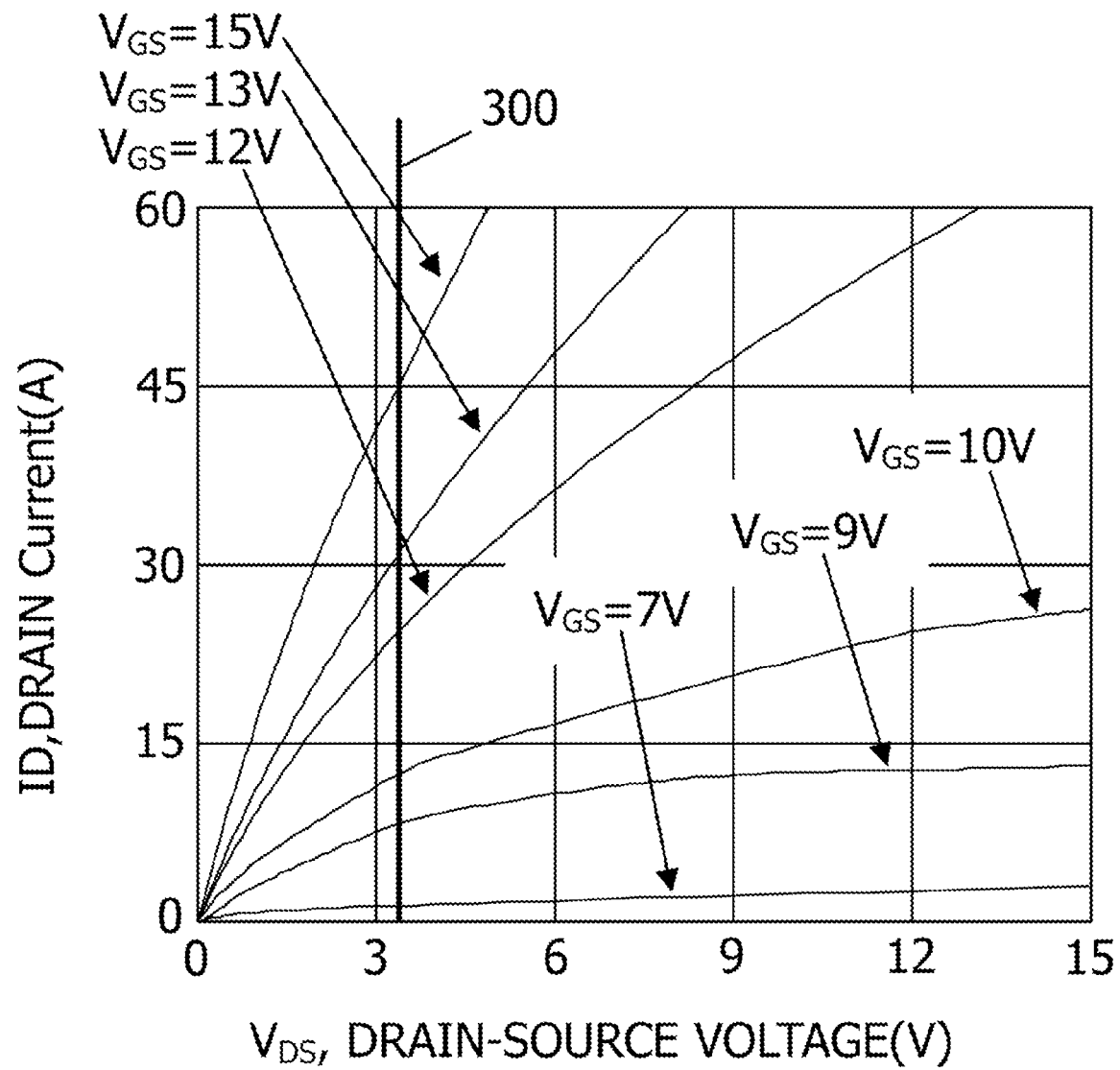
FIG. 2 is a first embodiment of the method for using a semiconductor intelligence line of the present invention.

As shown in FIG. 2, which is the first embodiment of the method for using a semiconductor intelligence line of the present invention. The first semiconductor 10 in FIG. 1 is an example of NVHL060N090SC1 (MOSFET-SIC Power, Single N-Channal), and a semiconductor intelligence line 300 is disposed on an output characteristics table of NVHL060N090SC1 in FIG. 2.

The semiconductor intelligence line 300 is disposed vertically on a drain-source voltage (VDS) axis, about a position at 3.5V.

The gate-source voltage (VGS) lines crossed by the semiconductor intelligence line 300 are 7V, 9V, 10V, 12V, 13V and 15V respectively, and the corresponding parallel and transverse drain current (ID) values are 2 A, 8 A, 12 A, 25 A, 32 A and 45 A. For example, when VGS=15V and ID=45 A, its VDS is 3.5V.

When VGS=12V and ID=25 A, its VDS is 3.5V.
When VGS=9V and ID=12 A, its VDS is 3.5V.
From the above, the semiconductor intelligence line 300 can use three different gate-source voltages at the 3.5V position on the drain-source voltage axis, that is, VGS=15V, 12V and 9V can get the corresponding drain current ID=45 A, 25 A and 12 A.

The corresponding drain current ID=45 A, 25 A and 12 A are the drain current values of the application limit. In application, if the drain current value exceeds the application limit, the circuit is open by the drain and the source of the first semiconductor 10, so that the function of indicating the drain and the source of the first semiconductor 10 to open circuit is achieved.

From the above, although the semiconductor intelligence line 300 is vertically disposed on the drain-source voltage axis at about 3.5V, the voltage value on the drain-source voltage axis can be changed according to the actual application requirements of the first semiconductor 10.

As shown in FIG. 2, the semiconductor intelligence line 300 is cut vertically through six different gate-source voltage lines. In practical applications, the semiconductor intelligence line 300 can also cut through only one gate-source voltage line vertically, but it is not limited to this.

Figure 3:
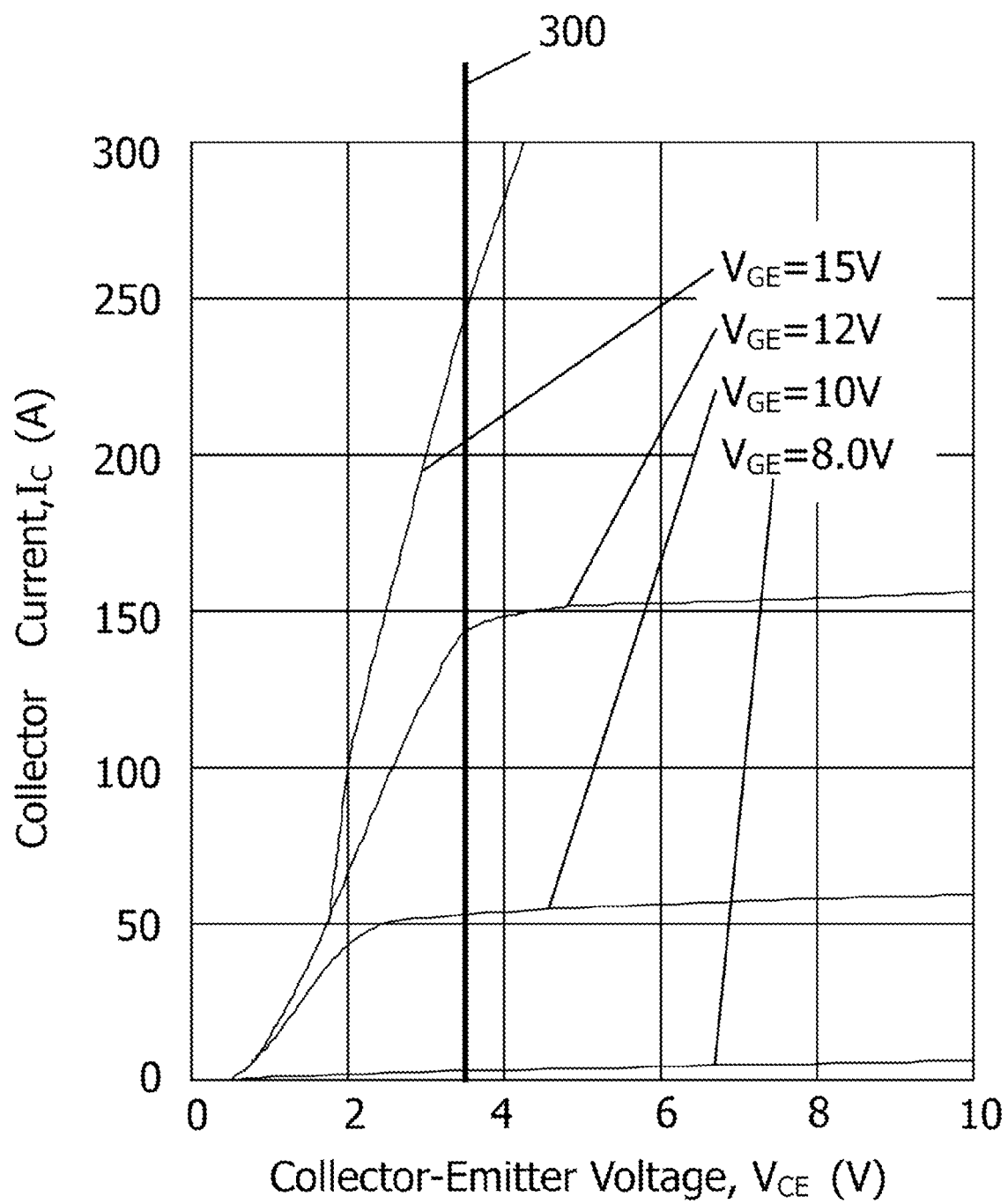
FIG. 3 is a second embodiment of the method for using a semiconductor intelligence line of the present invention.

As shown in FIG. 3, which is the second embodiment of the method for using a semiconductor intelligence line of the present invention. The first semiconductor 10 in FIG. 1 is an example of IRGP4266DPbF (IGBT), and a semiconductor intelligence line 300 is disposed on an output characteristics table of IRGP4266DPbF in FIG. 3.

The semiconductor intelligence line 300 is disposed vertically on the collector-emitter voltage (VCE) axis, about a position at 3.5V.

The gate-emitter voltage (VGE) lines crossed by the semiconductor intelligence line 300 are 8V, 10V, 12V and 15V respectively, and the corresponding parallel and transverse Collector Current (IC) values are 5 A, 55 A, 140 A and 240 A. For example, when VGE=15V and ICE=240 A, its VCE is 3.5V.

When VGE=12V and ICE=140 A, its VCE is 3.5V.
When VGE=10V and ICE=55 A, its VCE is 3.5V.
When VGE=8V and ICE=5 A, its VCE is 3.5V.
From the above, the semiconductor intelligence line 300 can use four different gate-emitter voltages at the 3.5V position on the collector-emitter voltage axis, that is, VGE=15V, 12V, 10V and 8V can get the corresponding collector-emitter current IC=240 A, 140 A, 50 A and 5 A.

The corresponding collector current IC=240 A, 140 A, 50 A and 5 A are the collector current values of the application limit. In application, if the collector current value exceeds the application limit, the circuit is open by the collector and the emitter of the first semiconductor 10, so that the function of indicating the collector and the emitter of the first semiconductor 10 to open circuit is achieved.

From the above, although the semiconductor intelligence line 300 is vertically disposed on the collector-emitter voltage axis at about 3.5V, the voltage value on the collector-emitter voltage axis can be changed according to the actual application requirements of the first semiconductor 10.

As shown in FIG. 3, the semiconductor intelligence line 300 is cut vertically through four different gate-emitter voltage lines. In practical applications, the semiconductor intelligence line 300 can also cut through only one gate-emitter voltage line vertically, but it is not limited to this.

Figure 4:
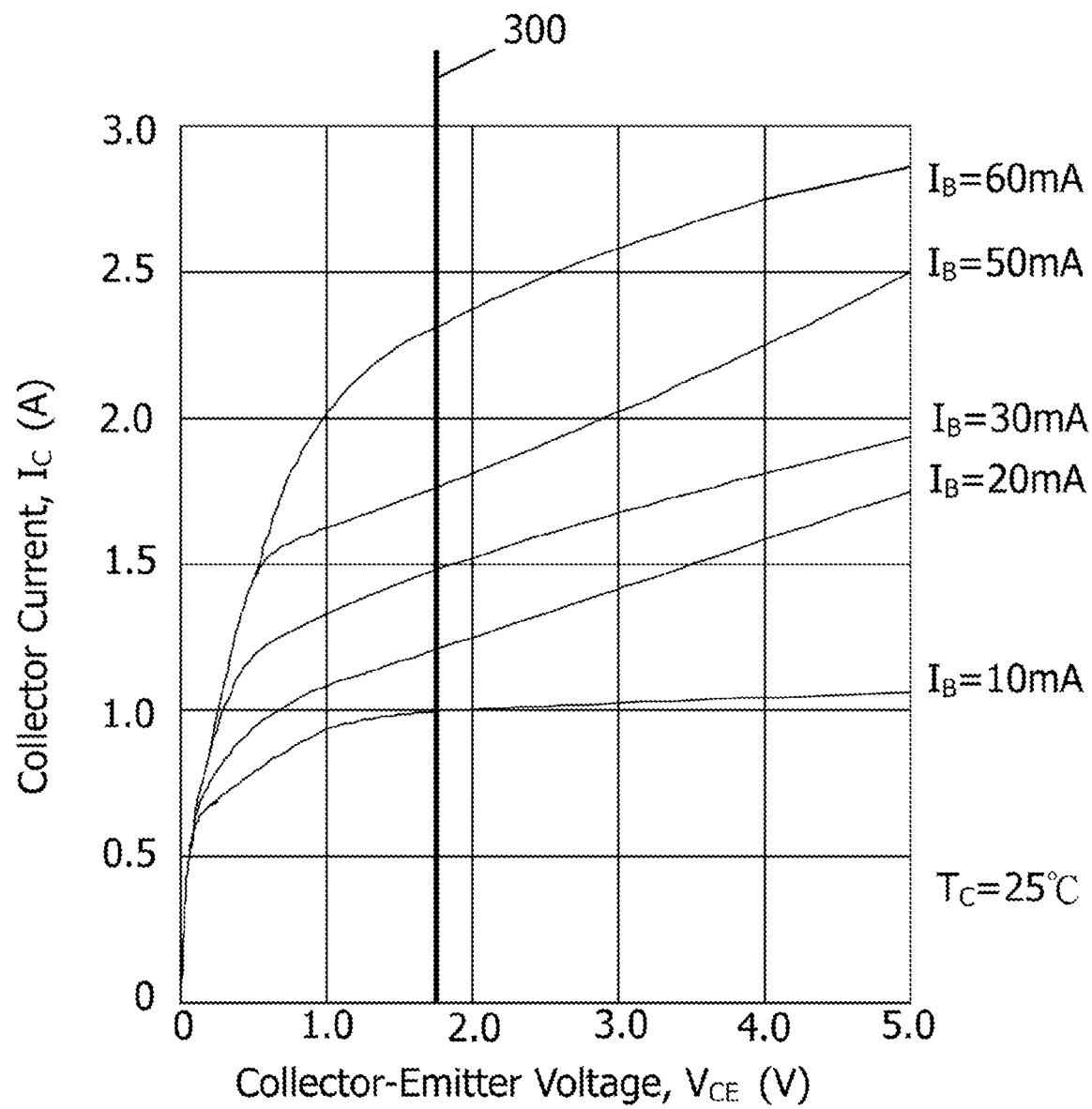
FIG. 4 is a third embodiment of the method for using a semiconductor intelligence line of the present invention.

As shown in FIG. 4, which is the third embodiment of the method for using a semiconductor intelligence line of the present invention. The first semiconductor 10 in FIG. 1 is an example of 2SD880 (NPN Silicon Transistor), and a semiconductor intelligence line 300 is disposed on an output characteristics table of 2SD880 in FIG. 4.

The semiconductor intelligence line 300 is disposed vertically on the collector-emitter voltage (VCE) axis, about a position at 1.7V.

The base current (IB) lines crossed by the semiconductor intelligence line 300 are 10 mA, 20 mA, 30 mA, 50 mA and 60 mA respectively, and the corresponding parallel and transverse Collector Current (IC) values are 1 A, 1.3 A, 1.5 A, 1.7 A and 2.3 A. For example, when IB=60 mA and IC=2.3 A, its VCE is 1.7V.

When IB=50 mA and IC=1.7 A, its VCE is 1.7V.
When IB=30 mA and IC=1.5 A, its VCE is 1.7V.
When IB=20 mA and IC=1.3 A, its VCE is 1.7V.
When IB=10 mA and IC=1 A, its VCE is 1.7V.
From the above, the semiconductor intelligence line 300 can use five different base current (IB) at the 1.7V position on the collector-emitter voltage (VCE) axis, that is, IB=60 mA, 50 mA, 30 mA, 20 mA and 10 mA can get the corresponding collector current IC=2.3 A, 1.7 A, 1.5 A, 1.3 A and 1 A.

The corresponding collector current IC=2.3 A, 1.7 A, 1.5 A, 1.3 A and 1 A are the collector current values of the application limit. In application, if the collector current value exceeds the application limit, the circuit is open by the collector and the emitter of the first semiconductor 10, so that the function of indicating the collector and the emitter of the first semiconductor 10 to open circuit is achieved.

From the above, although the semiconductor intelligence line 300 is vertically disposed on the collector-emitter voltage axis at about 1.7V, the voltage value on the collector-emitter voltage axis can be changed according to the actual application requirements of the first semiconductor 10.

As shown in FIG. 4, the semiconductor intelligence line 300 is cut vertically through five different base current lines. In practical applications, the semiconductor intelligence line 300 can also cut through only one base current line vertically, but it is not limited to this.

It can be seen from the above description that the semiconductor intelligence line 300 of the present invention can be implemented accordingly.

What is claimed is:

1. A method for using a semiconductor intelligence line, which indicates a drain and a source of a first semiconductor to open circuit when a drain current value exceeds the semiconductor intelligence line under a setting of a gate-source voltage, the method comprising:

disposing the semiconductor intelligence line vertically on a drain-source voltage axis of an output characteristics table of the first semiconductor;

cutting through at least one gate-source voltage line on the output characteristics table of the first semiconductor vertically by the semiconductor intelligence line; and crossing the semiconductor intelligence line and the gate-source voltage line to obtain a crossing point, which extends horizontally and crosses with a drain current axis of the output characteristics table of the first semiconductor.

2. The method of claim 1, wherein the drain current value of the drain current axis indicates an application limit of the drain current.

3. The method of claim 1, wherein the first semiconductor is a n-channel metal oxide semiconductor field effect transistor.

4. The method of claim 1, wherein the output characteristics table of the first semiconductor has at least one of the semiconductor intelligence line.

5. A method for using a semiconductor intelligence line, which indicates a collector and an emitter of a first semiconductor to open circuit when a collector current value exceeds the semiconductor intelligence line under a setting of a gate-emitter voltage, the method comprising:

disposing the semiconductor intelligence line vertically on a collector-emitter voltage axis of an output characteristics table of the first semiconductor;

cutting through at least one gate-emitter voltage line on the output characteristics table of the first semiconductor vertically by the semiconductor intelligence line; and crossing the semiconductor intelligence line and the gate-emitter voltage line to obtain a crossing point, which extends horizontally and crosses with a collector current axis of the output characteristics table of the first semiconductor.

6. The method of claim 5, wherein the collector current value of the collector current axis indicates an application limit of the collector current.

7. The method of claim 5, wherein the first semiconductor is an insulated gate bipolar transistor.

8. The method of claim 5, wherein the output characteristics table of the first semiconductor has at least one of the semiconductor intelligence line.

9. A method for using a semiconductor intelligence line, indicates a collector and an emitter of a first semiconductor to open circuit when a collector current value exceeds the semiconductor intelligence line under a setting of a base current, the method comprising:

disposing the semiconductor intelligence line vertically on a collector-emitter voltage axis of an output characteristics table of the first semiconductor;

cutting through at least one base current line on the output characteristics table of the first semiconductor vertically by the semiconductor intelligence line; and crossing the semiconductor intelligence line and the base current line to obtain a crossing point, which extends horizontally and crosses with a collector current axis of the output characteristics table of the first semiconductor.

10. The method of claim 9, wherein the collector current value of the collector current axis indicates the application limit of the collector current.

11. The method of claim 9, wherein the first semiconductor is an n-type transistor.

12. The method of claim 9, wherein the output characteristics table of the first semiconductor has at least one of the semiconductor intelligence line.

* * * * *